(12) United States Patent
Yang

(10) Patent No.: US 6,918,192 B2
(45) Date of Patent: Jul. 19, 2005

(54) SUBSTRATE DRYING SYSTEM

(75) Inventor: Jen-Yuan Yang, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/291,261

(22) Filed: Nov. 7, 2002

(65) Prior Publication Data

US 2004/0088880 A1 May 13, 2004

(51) Int. Cl.$^7$ ............................................. F26B 21/06
(52) U.S. Cl. ................... 34/73; 34/78; 34/92; 34/630
(58) Field of Search .......................... 34/73, 75, 76, 34/77, 78, 92, 107, 629, 630, 202, 218, 219, 74, 220, 221, 406–412, 417, 467–471, 476, 477, 493, 535, 543, 548, 83–84

(56) References Cited

U.S. PATENT DOCUMENTS

| | | | | |
|---|---|---|---|---|
| 5,440,824 A | * | 8/1995 | Ramachandran et al. | 34/443 |
| 5,443,540 A | * | 8/1995 | Kamikawa | 34/471 |
| 5,539,995 A | * | 7/1996 | Bran | 34/77 |
| 5,608,974 A | * | 3/1997 | Tanaka et al. | 34/78 |
| 5,709,037 A | * | 1/1998 | Tanaka et al. | 34/330 |
| 5,715,612 A | * | 2/1998 | Schwenkler | 34/470 |
| 5,855,077 A | * | 1/1999 | Nam et al. | 34/409 |
| 5,884,640 A | * | 3/1999 | Fishkin et al. | 134/95.2 |
| 6,029,371 A | * | 2/2000 | Kamikawa et al. | 34/516 |
| 6,128,830 A | * | 10/2000 | Bettcher et al. | 34/404 |
| 6,131,307 A | * | 10/2000 | Komino et al. | 34/486 |
| 6,134,807 A | * | 10/2000 | Komino et al. | 34/418 |
| 6,164,297 A | * | 12/2000 | Kamikawa | 134/61 |
| 6,199,298 B1 | * | 3/2001 | Bergman | 34/315 |
| 6,460,269 B2 | * | 10/2002 | Cho et al. | 34/58 |

* cited by examiner

*Primary Examiner*—Henry Bennett
*Assistant Examiner*—Andrea M. Ragonese
(74) *Attorney, Agent, or Firm*—Tung & Associates

(57) ABSTRACT

A substrate drying system for drying substrates after the substrates are washed typically using deionized water, is disclosed. The substrate drying system comprises a substrate cleaning tank in which the substrates are washed. A dry pump is provided in fluid communication with the substrate cleaning tank. A container which contains a supply of a liquid drying fluid, typically isopropyl alcohol (IPA), is further provided in fluid communication with the substrate cleaning tank. In application, the dry pump induces a reduced pressure inside the substrate cleaning tank and the drying fluid container. This reduces the vapor pressure, and thus, the boiling point of the drying fluid, such that the drying fluid is vaporized and remains in a vaporized state throughout transit to the substrate cleaning tank and during drying of the substrate. Consequently, premature condensation of the drying fluid in the substrate cleaning tank is prevented, eliminating the formation of water marks and deposit of particles particularly in deep trenches formed in the substrate.

12 Claims, 1 Drawing Sheet

SUBSTRATE DRYING SYSTEM

FIELD OF THE INVENTION

The present invention relates to systems for drying semiconductor wafer substrates after cleaning in the fabrication of semiconductor integrated circuits. More particularly, the present invention relates to a new and improved substrate drying system which prevents condensation of drying solvent on the substrate and formation of water marks on the substrate.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, particularly the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Currently, mini-environment based IC manufacturing facilities are equipped to control airborne particles much smaller than 1.0 $\mu$m, as surface contamination continues to be of high priority to semiconductor manufacturers. To achieve an ultra-clean wafer surface, particles must be removed from the wafer, and particle-removing methods are therefore of utmost importance in the fabrication of semiconductors.

The most common system for cleaning semiconductor wafers during wafer processing includes a series of tanks which contain the necessary cleaning solutions and are positioned in a "wet bench" in a clean room. Batches of wafers are moved in sequence through the tanks, typically by operation of a computer-controlled automated apparatus. Currently, semiconductor manufacturers use wet cleaning processes which may use cleaning agents such as deionized water and/or surfactants. Other wafer-cleaning processes utilize solvents, dry cleaning using high-velocity gas jets, and a megasonic cleaning process, in which very high-frequency sound waves are used to dislodge particles from the wafer surface. Cleaning systems which use deionized (DI) water currently are widely used in the industry because the systems are effective in removing particles from the wafers and are relatively cost-efficient. Approximately 4.5 tons of water are used for the production of each 200-mm, 16-Mbit, DRAM wafer. In the final process tank, the water and other rinse fluid is removed from the wafer surface using a solvent such as isopropyl alcohol (IPA). IPA is an organic solvent known to reduce the surface tension of water.

In one type of IPA drying method, wet substrates are moved into a sealed vessel and placed in the processing region of the vessel. An IPA vapor cloud is generated in a vapor-generating region of the vessel and is directed into the processing region, where it removes water from the wafers. This drying technology is highly effective in removing liquid from the wafers, but is not easily adaptable to single vessel systems in which chemical processing, rinsing, and drying can be carried out in a single vessel.

Environmental concerns have given rise to efforts to improve drying technology in a manner that minimizes IPA usage. One such improved drying technology is the Marongoni technique. In one application of the Marongoni technique, an IPA vapor is condensed on top of the rinse water containing the wafers while the wafers are slowly lifted from the processing vessel. The concentration of the dissolved vapor is highest at the wafer surfaces and lower at the regions of the rinse fluid that are spaced from the wafer surfaces. Because surface tension decreases as IPA concentration increases, the surface tension of the water is lowest at the wafer surface where the IPA concentration is highest. The concentration gradient thus results in "Marongoni flow" of the rinse water away from the surfaces of the wafers. Rinse water is thereby stripped from the wafer surfaces, leaving the wafer surfaces dry.

One example of a conventional Marongoni system 10 which employs the Marongoni technique is illustrated schematically in FIG. 1. The system 10 includes an IPA container 12 which contains a supply of isopropyl alcohol. A valve 15 is provided between an IPA outlet line 14 which leads from the IPA container 12 and an IPA transfer line 16 which leads to a substrate cleaning tank 18. A nitrogen gas supply 20 is provided in fluid communication with the IPA transfer line 16 through a nitrogen flow line 22, which is typically fitted with a valve 24, a filter 26 and a flow meter 28. The nitrogen gas supply 20 is typically further provided in fluid communication with the IPA container 12 through a second nitrogen flow line 22a, typically fitted with a valve 24a, a filter 26a and a flow meter 28a.

In a substrate drying process using the system 10, a substrate (not shown) is first rinsed in the substrate cleaning tank 18 using DI (deionized) water. Next, nitrogen gas is distributed from the nitrogen gas supply 20 to the IPA transfer line 16 through the nitrogen flow line 22, while IPA vapor is distributed from the IPA container 12 to the IPA transfer line 16 through the IPA outlet line 14 and valve 15. The IPA vapor mixes with the nitrogen gas in the IPA transfer line 16, and is introduced into the substrate cleaning tank 18. A meniscus-shaped gradient is formed along the interface between the surface of the substrate and the DI water, and as the substrate is removed from the substrate cleaning tank 18, the water flows along the meniscus portion and is thereby removed from the substrate, with no water remaining on the substrate upon complete removal of the substrate from the tank 18.

During the drying operation of the conventional Marongoni system 10 heretofore described, the IPA vapor is carried by nitrogen gas from the IPA container 12, through the IPA transfer line 16 and to the substrate cleaning tank 18 typically at atmospheric pressure. However, as it has a boiling point of 82° C. at atmospheric pressure, the IPA condenses into liquid from the vapor state upon cooling below this temperature. Accordingly, during transit through the IPA transfer line 16, the nitrogencarried, vaporized IPA tends to condense to form liquid IPA. Upon entry into the substrate cleaning tank 18, the liquified IPA tends to induce formation of water marks in and carry particles into deep sub-micron trenches formed in the substrate during the course of IC fabrication. This adversely affects the yield of devices on the substrate. Furthermore, the filter 26a tends to become blocked by the liquified IPA. Accordingly, a system is needed for maintaining the IPA in a vaporized state throughout drying of substrates after washing in order to prevent formation of water marks in the devices formed on the substrate.

An object of the present invention is to provide a new and improved system for drying substrates.

Another object of the present invention is to provide a substrate drying system in which control of drying fluid vapor concentration is enhanced, particularly for advanced process applications.

Another object of the present invention is to provide a new and improved system for drying substrates, which system prevents formation of water marks and deposition of particles on the substrates induced by prematurely-condensed or liquified drying fluid such as IPA (isopropyl alcohol).

Still another object of the present invention is to provide a system for maintaining a drying fluid in a vaporized state as the drying fluid is transported from a container to a substrate cleaning tank and during drying of substrates in the substrate cleaning tank.

Another object of the present invention is to provide a new and improved substrate drying system which may be adapted for use in Marongoni-type substrate drying systems for drying substrates.

Yet another object of the present invention is to provide a system for lowering the boiling point of a drying fluid in order to prevent liquification of the drying fluid during drying of substrates after washing.

A still further object of the present invention is to provide a system which reduces the boiling point of a drying fluid for substrates by reducing pressure in the system during drying of substrates in order to prevent liquification of the drying fluid and formation of water marks particularly in deep trenches formed on the substrates.

Yet another object of the present invention is to provide a new and improved system for enhancing wafer yield in the fabrication of semiconductor integrated circuits on substrates.

A still further object of the present invention is to provide a system which reduces the presence of particles remaining on substrates after washing and drying of the substrates.

Yet another object of the present invention is to provide a new and improved method for drying substrates after washing.

SUMMARY OF THE INVENTION

In accordance with these and other objects and advantages, the present invention is generally directed to a substrate drying system for drying substrates after the substrates are washed typically using deionized water. The substrate drying system comprises a substrate cleaning tank in which the substrates are washed. A dry pump is provided in fluid communication with the substrate cleaning tank, and a throttle valve may be provided between the dry pump and the substrate cleaning tank. A container which contains a supply of a liquid drying fluid, typically isopropyl alcohol (IPA) is provided in fluid communication with the substrate cleaning tank. A nitrogen supply which contains a supply of nitrogen gas may further be provided in fluid communication with the substrate cleaning tank. In application, the dry pump induces a reduced pressure inside the substrate cleaning tank and the drying fluid container. This reduces the vapor pressure, and thus, the boiling point of the drying fluid, such that the drying fluid is vaporized and remains in a vaporized state throughout transit to the substrate cleaning tank and during drying of the substrate. Consequently, the drying fluid is effective in removing DI cleaning water from the substrate and thus, preventing the formation of water marks particularly in deep trenches formed in the substrate.

BRIEF DESCRIPTION OF THE DRAWING

The invention will now be described, by way of example, with reference to the accompanying drawing, in which.

DESCRIPTION OF THE PREFERRED EMBODIMENTS

The present invention has particularly beneficial utility in the drying of semiconductor wafer substrates after washing of the substrates during the fabrication of integrated circuits on the substrates. However, the invention is not so limited in application, and while references may be made to such semiconductor wafer substrates, the present invention is applicable to drying substrates in a variety of industrial and mechanical applications.

The present invention is directed to a Marongoni-type substrate drying system for drying substrates after the substrates are washed typically using deionized water. The substrate drying system utilizes a reduced air or gas pressure inside the substrate cleaning tank in which the substrates are dried, and this reduces the vapor pressure, and thus, the boiling point of the drying fluid, typically isopropyl alcohol (IPA). Consequently, the drying fluid remains in a vaporized state throughout drying of the substrate in the substrate cleaning tank. DI cleaning water is thus thoroughly removed from the substrate and the drying fluid does not prematurely condense in the cleaning tank, and this prevents the formation of water marks and deposition of particles on device structures, particularly deep submicron trenches, formed in the substrate.

Figure 1:
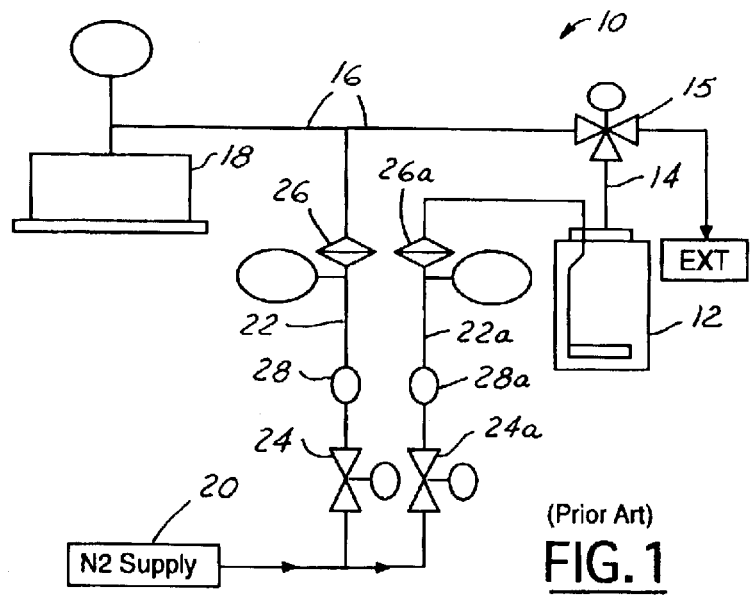
FIG. 1 is a schematic view of a typical conventional Marongoni-type drying system for substrates.
Figure 2:
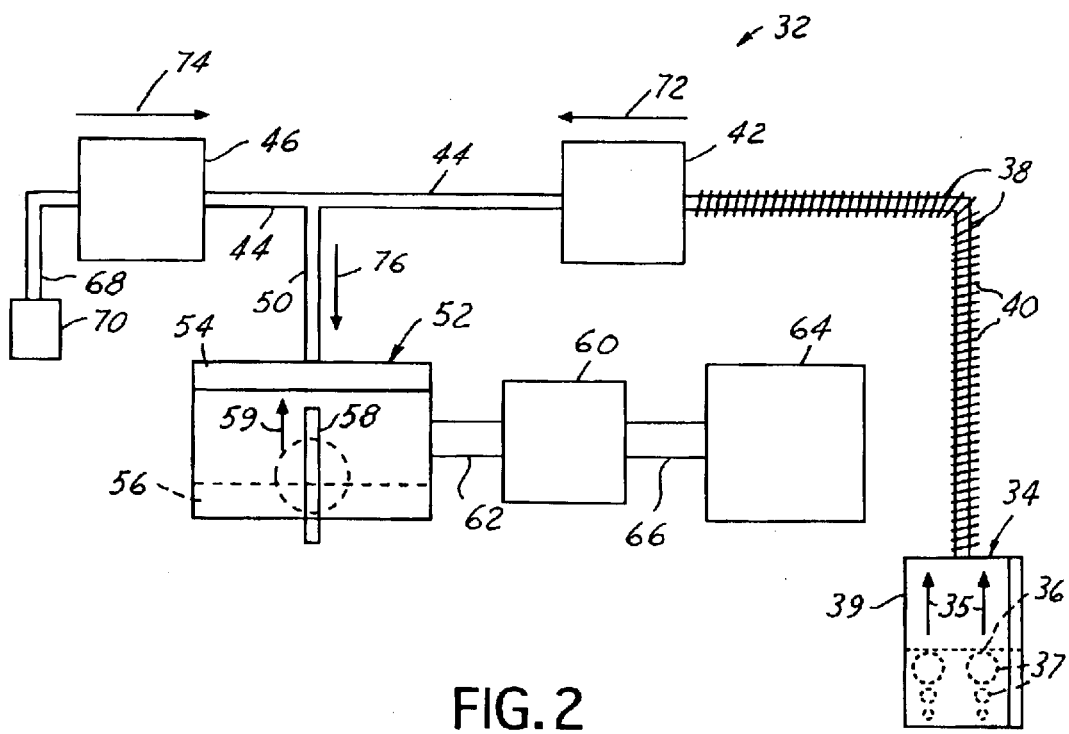
FIG. 2 is a schematic view of an illustrative embodiment of the substrate drying system of the present invention.

Referring to FIG. 2, the substrate drying system 32 of the present invention includes an IPA (isopropyl alcohol) container 34 which typically contains a supply of liquid IPA 36. While the invention will be described with IPA as the drying fluid for substrates, it is understood that the present invention may be applicable using liquid drying fluids other than IPA. A heater 39 may be provided in thermally-conductive contact with the IPA container 34 for maintaining the contents of the IPA container 34 above a selected temperature, typically 50° C., for purposes which will be hereinafter described. An IPA fluid outlet conduit 38 confluently connects the outlet of the IPA container 34 to an inlet end of an IPA mass flow controller 42, which controls the flow rate of vaporized IPA as hereinafter described. A heating coil 40 typically winds around the IPA fluid outlet conduit 38. A fluid transfer conduit 44 confluently connects an outlet end of the IPA mass flow controller 42 to an outlet end of a nitrogen mass flow controller 46. A nitrogen supply conduit 68 confluently connects a nitrogen supply 70 to an inlet end of the nitrogen mass flow controller 46.

A mixed fluid inlet conduit 50 confluently extends from the fluid transfer line 44, between the IPA mass flow controller 42 and the nitrogen mass flow controller 46, and is confluently connected to a substrate cleaning tank 52. The mixed fluid inlet conduit 50 typically extends through a heating lid 54 provided on the substrate cleaning tank 52. The substrate cleaning tank 52 is adapted for supporting a substrate 58 therein in a vertical position for washing of the substrate 58 typically using DI (deionized) water 56, which is contained in the bottom portion of the substrate cleaning tank 52, typically in conventional fashion. A throttle valve 60 is disposed in confluent communication with the substrate cleaning tank 52, typically through a valve conduit 62. A dry pump 64 is disposed in confluent communication with the throttle valve 60, typically through a pump conduit 66.

Referring again to FIG. 2, typical operation of the substrate drying system 32 is as follows. First, the substrate 58 is thoroughly washed using rinsing deionized water 56 according to parameters which are well-known by those skilled in the art. The deionized water 56 is typically maintained at a temperature of about 20° C. Next, the substrate 58 is dried as follows. As the IPA 36 in the IPA container 34 is heated to a temperature of typically about 50° C., the dry pump 64 is operated, through the throttle valve 60, to reduce air pressure in the substrate cleaning tank 52, the mixed fluid inlet conduit 50, the fluid transfer conduit 44, the IPA fluid outlet conduit 38 and the IPA container 34, respectively. The throttle valve 60 induces a pressure of preferably about 0.1~0.2 bar in the substrate cleaning tank 52, the mixed fluid inlet conduit 50, the fluid transfer conduit 44, the IPA fluid outlet conduit 38 and the IPA container 34. Due to the reduced air pressure in the IPA container 34, the boiling point of the IPA 36 therein is reduced to a temperature equal to or below typically about 50° C. Consequently, the liquid IPA 36 begins to boil and vaporize, forming vapor bubbles 37 which rise to the surface of the liquid IPA 36 and release vaporized IPA 36 into the upper portion of the IPA container 34, as indicated by the vapor arrows 35. The vaporized IPA is drawn through the IPA fluid outlet conduit 38, where the IPA is maintained in the vaporized state at a temperature of at least typically about 50° C., the lowered boiling point of the IPA, by the heating coil 40. The IPA mass flow controller 42 controls the flow of the vaporized IPA from the IPA fluid outlet conduit 38 to the fluid transfer conduit 44, as indicated by the IPA fluid flow arrow 72. Simultaneously, nitrogen gas flows from the nitrogen supply 70, through the nitrogen supply conduit 68 and nitrogen mass flow controller 46, respectively, and into the fluid transfer conduit 44, as indicated by the nitrogen gas flow arrow 74. The flowing nitrogen gas and vaporized IPA then flow through the mixed fluid inlet conduit 50 and into the substrate cleaning tank 52, as indicated by the mixed fluid flow arrow 76. Finally, as the mixed nitrogen and vaporized IPA enter the substrate cleaning tank 52, the heating lid 54 maintains the vaporized IPA at the reduced IPA boiling point temperature, typically about 50° C., in the vaporized state and thus, prevents premature condensation or liquification of the IPA in the substrate cleaning tank 52.

As the mixed nitrogen and vaporized IPA flows into the substrate cleaning tank 52, the substrate 58 is slowly raised from the DI water 56, as indicated by the lift arrow 59. The mixed IPA vapor and nitrogen gas are blown onto the wet surface of the substrate 58 and, as a result, the IPA condenses onto the surface of the water film on the substrate 58 and forms an IPA layer (not shown) on the surface of the water film. The IPA layer lowers the surface tension of the water film remaining on the surface of the substrate 58, and the water thus flows from the surface of the substrate 58. Because the IPA is maintained in a vaporized state until it condenses onto the water film on the substrate 58, the IPA does not prematurely liquify and condense in the substrate cleaning tank 52. Consequently, the vaporized IPA completely removes the residual DI water remaining on the substrate 58 and prevents the formation of liquid condensates and deposition of particles which may otherwise promote the formation of water marks on or otherwise contaminate device structures in the substrate 58, particularly deep trench structures. Therefore, the devices on the substrate 58 remain unaffected by the cleaning and drying process, and device performance, as well as wafer yield, are increased.

While the preferred embodiments of the invention have been described above, it will be recognized and understood that various modifications can be made in the invention and the appended claims are intended to cover all such modifications which may fall within the spirit and scope of the invention.

What is claimed is:

1. A system for drying a substrate, comprising:
    a substrate cleaning tank for containing the substrate;
    a mixed fluid conduit provided in fluid communication with said substrate cleaning tank for mixing a vaporized drying fluid with nitrogen gas and introducing the vaporized drying fluid mixed with the nitrogen gas into said substrate cleaning tank;
    a pump provided in fluid communication with said substrate cleaning tank for reducing a gas pressure in said substrate cleaning tank and lowering a boiling point of said drying fluid;
    a container provided in fluid communication with said mixed fluid conduit for initially containing the drying fluid;
    a gas mass flow controller interposed between said container and said mixed fluid conduit for controlling flow of the drying fluid in vaporized form from said container to said mixed fluid conduit; and
    a heat-inducible fluid outlet conduit provided between said container and said gas mass flow controller for maintaining the drying fluid in a vaporized state between said container and said gas mass flow controller.

2. The system of claim 1 further comprising a throttle valve disposed between said pump and said substrate cleaning tank for controlling a reduction in said gas pressure.

3. The system of claim 1 further comprising a heating lid provided on said substrate cleaning tank for heating the drying fluid.

4. The system of claim 3 further comprising a throttle valve disposed between said pump and said substrate cleaning tank for controlling a reduction in said gas pressure.

5. A system for drying a substrate, comprising:
    a container for containing a supply of liquid drying fluid and vaporizing the drying fluid;
    a nitrogen source for containing a supply of nitrogen gas;
    a mixed fluid conduit provided in fluid communication with said container and said nitrogen source for mixing the drying fluid with the nitrogen gas;
    a fluid outlet conduit connecting said container to said mixed fluid conduit for distributing the drying fluid in vapor form from said container to said mixed fluid conduit;
    a heating coil provided in thermal contact with said fluid outlet conduit for maintaining the drying fluid in vapor form in said fluid outlet conduit;
    a substrate cleaning tank provided in fluid communication with said mixed fluid conduit for receiving the drying fluid mixed with the nitrogen gas and containing the substrate; and a pump provided in fluid communication with said substrate cleaning tank for reducing a gas pressure in said container and said substrate cleaning tank and reducing a boiling point of said drying fluid.

6. The system of claim 5 further comprising a throttle valve disposed between said pump and said substrate cleaning tank for controlling a reduction in said gas pressure.

7. The system of claim 5 further comprising a heating lid provided on said substrate cleaning tank for heating the liquid drying fluid.

8. The system of claim 7 further comprising a throttle valve disposed between said pump and said substrate cleaning tank for controlling a reduction in said gas pressure.

9. The system of claim 5 further comprising a mass flow controller interposed between said container and said substrate cleaning tank for controlling flow of the drying fluid from said container to said substrate cleaning tank.

10. The system of claim 9 further comprising a throttle valve disposed between said pump and said substrate cleaning tank for controlling a reduction in said gas pressure.

11. The system of claim 9 further comprising a heating lid provided on said substrate cleaning tank for heating the liquid drying fluid.

12. The system of claim 5 further comprising a mass flow controller disposed between said nitrogen source and said substrate cleaning tank for controlling flow of said nitrogen gas.

* * * * *